United States Patent [19]

Gilder, Jr. et al.

[11] Patent Number: 4,629,824
[45] Date of Patent: Dec. 16, 1986

[54] IC PACKAGE SEALING TECHNIQUE

[75] Inventors: Thomas G. Gilder, Jr., Warren; Raymond D. O'Dean, Dover, both of Pa.

[73] Assignee: GTE Products Corporation, Stamford, Conn.

[21] Appl. No.: 686,567

[22] Filed: Dec. 24, 1984

[51] Int. Cl.⁴ .............................................. H01L 23/02
[52] U.S. Cl. .................... 174/52 FP; 357/70
[58] Field of Search ................ 174/52 FP, 52 S; 357/70

[56] References Cited

FOREIGN PATENT DOCUMENTS 0044764 3/1980 Japan ..................................... 357/70
0082552 5/1983 Japan ..................................... 357/70

Primary Examiner—Arthur T. Grimley
Assistant Examiner—D. A. Tone
Attorney, Agent, or Firm—William H. McNeill

[57] ABSTRACT

An IC package with an improved seal includes a sealant penetrator in the form of a projection on each lead for penetrating the provided seal. In a preferred embodiment the penetrator is a semi-circular projection formed on the lead which penetrates the sealant material.

4 Claims, 5 Drawing Figures

IC PACKAGE SEALING TECHNIQUE

TECHNICAL FIELD

This invention relates to integrated circuit packages and more particularly to sealing techniques therefor.

BACKGROUND ART

After an IC chip has been mounted on a lead frame chip carrier, and electrically connected to the leads thereof, it is often packaged in encapsulating material. Such packaged chip-containing lead frames are shown in, for example, the following U.S. Pat Nos.: 4,331,831; 4,301,464; 4,298,883; 4,264,917; 4,214,364; 4,132,856; 4,124,864; 4,079,511; 3,978,516; 3,793,474; 3,684,464; 3,659,821; 3,611,061; 3,436,810; and U.S. patent application Ser. No. 584,080; filed Feb. 27, 1984, the teachings of the latter application being incorporated herein by reference.

As pointed out in the above, the lead frames are usually made by stamping or etching metal strips. Where the manufactured quantities are sufficiently great, stamping is preferred because of its lower cost.

To fabricate the IC package, a plurality of electrically conductive lead-ins are attached to an electrically insulating base or substrate. An IC chip is then affixed to the base and electrical connections made between the chip and the lead-ins. A cover of similar insulating material is then affixed to the base and a sealant is provided between the base and cover to environmentally protect the chip. The sealant can be injected in fluid form as described in the above-identified application or it can be employed as a self-supporting medium as described in Ser. No. 659,212, filed Oct. 9, 1984. While each of these methods and techniques work, they occasionally present control problems in consistency of the seals.

SUMMARY OF THE INVENTION

It is, therefore, an object of the invention to obviate the disadvantages of the prior art.

It is another object of the invention to enhance the sealing techniques for IC packages.

These objects are accomplished, in one aspect of the invention, by the provision of an IC package which comprises an electrically insulating substrate having a portion formed to receive an IC chip and a plurality of electrically conductive, relatively rigid, metal lead-in connectors. The lead-in connectors have a first end portion adjacent the chip receiving portion and a second end remote from the first end. A cover is accommodated by the substrate and has an inner surface provided with a circumferential sealant groove formed therein. A deformable sealant is provided in the groove and a sealant penetrator is formed on each of the lead-ins intermediate the ends thereof and in alignment with the sealant. Employment of the sealant penetrators assures a better environmental seal for the IC package.

Figure 1:
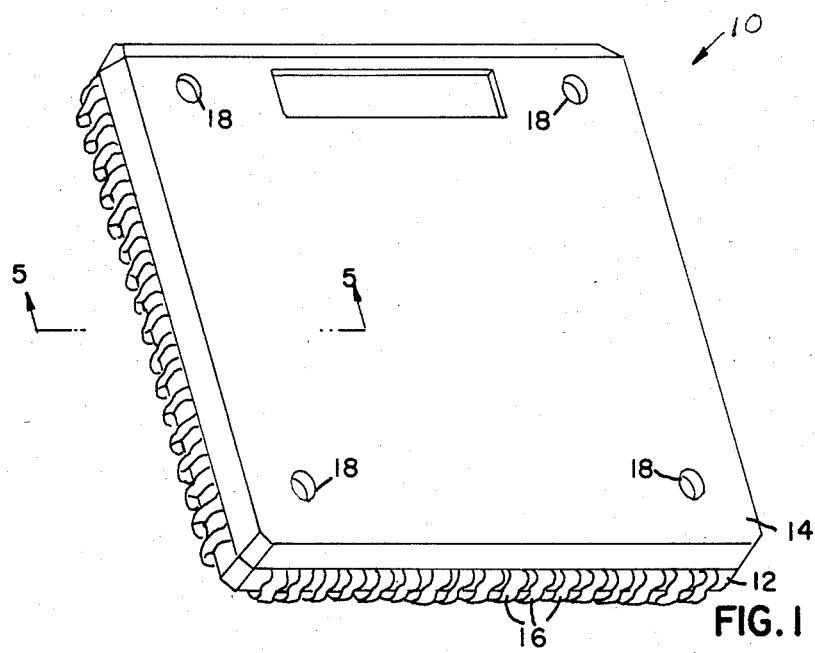
FIG. 1 is a perspective view of an IC package.

Referring now to the drawings with greater particularly, there is shown in FIG. 1 an IC package 10 comprised of a base or substrate 12 and a cover 14. A plurality of lead-ins affixed to base 12 have their second ends 16 projecting peripherally therefrom. Cover 14 can be provided with four apertures 18 for engaging four posts 20 formed on base 12 for affixing the base and cover together.

Figure 2:
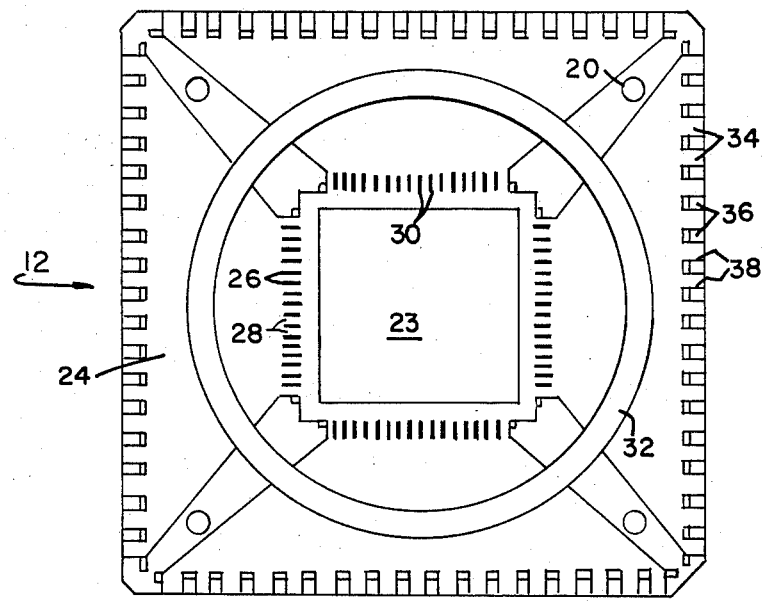
FIG. 2 is a plan view of the inner surface of a base or substrate.
Figure 5:
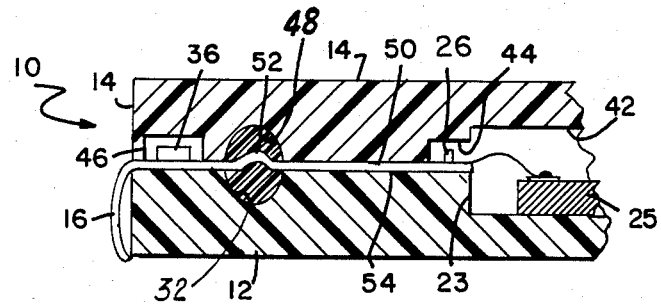
FIG. 5 is a sectional view taken along the line 5-5 of FIG. 1.

In FIG. 2 there is shown a base 12, made of a high temperature thermoplastic material, such as a polyetherimide resin made by General Electric Co., Pittsfield, Mass., under the trade name ULTEM. In the center of base 12 is a recess 23 in which an IC chip 25 (see FIG. 5) is eventually disposed. Surrounding recess 23 are raised projections 26. Spaces 28 exist between the projections 26. On the inner end of each projection 26 is another raised portion 30. Raised portions 30 provide means for securing the lead-ins in spaces 28 as shown in the above-described Ser. No. 584,080. There is an encircling groove 32 outside the perimeter formed by all the projections 26, the groove being semi-circular in cross-section.

At the periphery of base 12 there are additional slots 34 for the outer portions of the lead-ins. Slots 34 are formed by projections 36 which are similar to projections 26 but bigger. There are raised portions 38 on the inner ends of projections 36, similar to raised portions 30 on projections 26. There are four posts 20 on base 12 for accurate mating of base 12 with cover 14, which is made of the same plastic as base 12.

Figure 3:
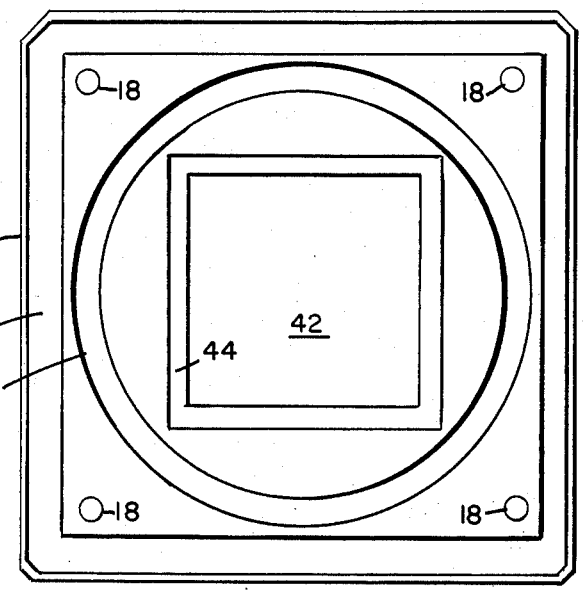
FIG. 3 is a plan view of the inner surface of a cover.

Cover 14 (FIG. 3) has a recess 42 to mate with recess 23, and has additional recesses 44 and 46 to accommodate projections 26 and 36. Cover 14 also has a groove 48, semi-circular in cross-section, to mate with groove 32, and four holes 18 into which posts 20 fit.

Figure 4:
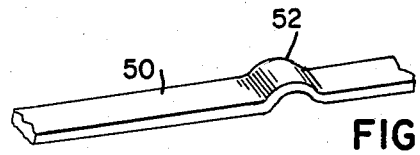
FIG. 4 is a perspective view of a lead-in connector in accordance with an aspect of the invention.

The lead-in connectors 50 are each provided with a sealant penetrator 52, as seen in FIG. 4. As shown therein the penetrator 52 is semi-circular; however, this is exemplary only, and the penetrator may have any configuration compatable with the sealant.

Further, the sealant can be a liquid inserted as described in the above-mentioned Ser. No. 584,080, or a self-supporting sealant as described in Ser. No. 659,212.

The penetrator 52 is positioned intermediate the first or internal end 54 and the second or external end 16, and in alignment with the sealant; i.e., the sealant groove. Since, in the embodiment shown, the sealant grooves 48 and 32 are circular, it will be apparent that the penetrator 52 on each lead-in 50 will be in a slightly different position.

In an alternate embodiment, it is possible to eliminate the groove 32 in the base 12.

Assembly of the components proceeds as follows. Four lead frame segments would be placed on top of base 12, one at a time and one in each quadrant, as shown in Ser. No. 548,080. Each segment is carefully positioned so that the internal ends 54 lie in spaces 28 and the external ends 16 lie in slots 34. Pressure is then applied to the segments to ensure that they are flush against the surface of base 12 and then maintaining the pressure, heat is applied to portions 30 and 38 to cause them to flow over, and secure in place the internal ends and the external ends of the leads. This construction ensures accurate positioning, with secure attachment, of all of the leads with excellent co-planarity thereof.

Next, an IC chip 25 would be conventionally attached in the pad area, recess 30, and would be conventionally electrically connected to the internal ends of the lead-ins. The external ends 16 of the leads 50 can now be formed into a desired shape.

If the sealant is of the self-supporting kind shown in Ser. No. 659,212, it is placed in groove 48 of cover 14 and cover 14 is placed on base 12; posts 20 fitting into holes 18 for subsequent sealing. As the cover 14 is pressed upon base 12, the penetrators 52 penetrate the sealing washer. The excess material of the sealing washer flows into groove 32 in base 12.

Alternatively, the cover 14 may be attached to base 12 and a fluid sealant inserted thereinto through an appropriate aperture in cover 14 (not shown herein, but described in Ser. No. 584,080).

The sealant penetrator provided by this invention increases the reliability of the environmental seal required by IC packages and thus provides an improved product.

While there have been shown and described what are at present considered to be the preferred embodiments of the invention, it will be apparent to those skilled in the art that various changes and modifications can be made herein without departing from the scope of the invention as defined by the appended claims.

What is claimed is:

1. An integrated circuit package comprising: an electrically insulating substrate having a portion formed to receive an integrated circuit chip and a plurality of electrically conductive, relatively rigid, metal lead-in connectors; said lead-in connectors having a first end adjacent said portion and a second end remote from said first end; a cover formed to be accommodated by said substrate, said cover having an inner surface and an outer surface; a circumferential sealant groove formed in said inner surface; a deformable sealant in said groove; and a sealant penetrator formed on each of said lead-ins intermediate the ends thereof and in alignment with said sealant.

2. The integrated circuit package of claim 1 wherein said sealant penetrator projects above the plane of said substrate.

3. The integrated circuit package of claim 2 wherein said groove is semi-circular in cross-section.

4. The integrated circuit package of claim 3 wherein said sealant penetrator is semi-circular in cross-section.

* * * * *